US011121189B2

(12) United States Patent
Cheng et al.

(10) Patent No.: US 11,121,189 B2
(45) Date of Patent: Sep. 14, 2021

(54) DISPLAY PANEL AND DISPLAY DEVICE

(71) Applicant: BOE TECHNOLOGY GROUP CO., LTD., Beijing (CN)

(72) Inventors: Chih-Jen Cheng, Beijing (CN); Pengpeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 767 days.

(21) Appl. No.: 15/777,994

(22) PCT Filed: Oct. 17, 2017

(86) PCT No.: PCT/CN2017/106515
§ 371 (c)(1),
(2) Date: May 22, 2018

(87) PCT Pub. No.: WO2018/171174
PCT Pub. Date: Sep. 27, 2018

(65) Prior Publication Data
US 2021/0210567 A1 Jul. 8, 2021

(30) Foreign Application Priority Data

Mar. 22, 2017 (CN) .......................... 201710174810.2

(51) Int. Cl.
*H01L 27/32* (2006.01)
*G06K 19/06* (2006.01)
(Continued)

(52) U.S. Cl.
CPC .... *H01L 27/3227* (2013.01); *G06K 19/06112* (2013.01); *G09G 3/3266* (2013.01); *G09G 3/3677* (2013.01); *G09G 2360/148* (2013.01)

(58) Field of Classification Search
None
See application file for complete search history.

(56) References Cited

U.S. PATENT DOCUMENTS 6,823,727 B2 11/2004 Friedel et al.
10,503,947 B2 12/2019 Liu et al.
(Continued)

FOREIGN PATENT DOCUMENTS

CN 1573531 A 2/2005
CN 1577416 A 2/2005
(Continued)

OTHER PUBLICATIONS

Chinese Office Action in Chinese Application No. 201710174810.2, dated May 30, 2019 with English translation.
(Continued)

*Primary Examiner* — Aneeta Yodichkas
(74) *Attorney, Agent, or Firm* — Collard & Roe, P.C.

(57) ABSTRACT

A display panel and a display device are disclosed. The display panel includes a display array, an imaging array and a pinhole array layer. The display array includes a plurality of display pixels which are arrayed, and each of the display pixels includes a luminous element. The imaging array is disposed at a side of the display array facing away from a light exiting direction of the display panel, and includes a plurality of imaging pixels which are arrayed. The pinhole array layer is disposed at a side of the imaging array facing to the light exiting direction of the display panel, and includes a plurality of pinholes which are arrayed, the plurality of pinholes are corresponding to the plurality of imaging pixels. The display device includes the above-mentioned display panel, a display driver circuit and an image detection circuit.

20 Claims, 5 Drawing Sheets

(51) Int. Cl.
*G09G 3/36* (2006.01)
*G09G 3/3266* (2016.01)

(56) References Cited

U.S. PATENT DOCUMENTS

| | | | |
|---|---|---|---|
| 2004/0263069 | A1 | 12/2004 | Yamazaki et al. |
| 2004/0263670 | A1 | 12/2004 | Yamasaki |
| 2009/0015767 | A1 | 1/2009 | Ishibe |
| 2010/0302223 | A1 | 12/2010 | Sakamoto et al. |
| 2014/0085169 | A1 | 3/2014 | Illek et al. |
| 2015/0187980 | A1 | 7/2015 | Yamamoto |
| 2016/0019409 | A1 | 1/2016 | Cheng et al. |
| 2016/0035940 | A1 | 2/2016 | Fujita et al. |
| 2019/0156097 | A1 | 5/2019 | Liu et al. |

FOREIGN PATENT DOCUMENTS

| | | |
|---|---|---|
| CN | 200953215 Y | 9/2007 |
| CN | 101339917 A | 1/2009 |
| CN | 101878495 A | 11/2010 |
| CN | 103460277 A | 12/2013 |
| CN | 106298859 A | 1/2017 |
| CN | 205910951 U | 1/2017 |
| CN | 106449716 A | 2/2017 |
| JP | 2015028976 A | 2/2015 |
| WO | 2006/109010 A1 | 10/2006 |

OTHER PUBLICATIONS

Partial Supplementary European Search Report in European Application No. 17870646.1 dated Oct. 7, 2020.
Extended European Search Report in European Application No. 17870646.1 dated Dec. 9, 2020.
International Search Report of PCT/CN2017/106515 in Chinese, dated Jan. 16, 2018 with English translation.
Notice of Transmittal of the International Search Report of PCT/CN2017/106515 in Chinese, dated Jan. 16, 2018.
Written Opinion of the International Searching Authority of PCT/CN2017/106515 in Chinese, dated Jan. 16, 2018 with English translation.

DISPLAY PANEL AND DISPLAY DEVICE

CROSS REFERENCE TO RELATED APPLICATIONS

This application is the National Stage of PCT/CN2017/106515 filed on Oct. 17, 2017, which claims priority under 35 U.S.C. § 119 of Chinese Application No. 201710174810.2 filed on Mar. 22, 2017, the disclosure of which is incorporated by reference.

TECHNICAL FIELD

Embodiments of the present disclosure relate to a display panel and a display device.

BACKGROUND

Barcode (e.g., one-dimensional bar code or two-dimensional code) is a type of graphic identifier recording information by graphics, which are arranged along one-dimensional direction or two-dimensional direction according to a certain coding rule, with black and white colors. The barcode is widely used in fields such as mobile payment, logistics storage, ticket booking and ticket checking. A barcode scanning operation can be performed by a barcode scanner or a mobile electronic device equipped with an imaging element. During barcode scanning by the barcode scanner or the mobile electronic device, it usually needs to image the barcode with a lens for focusing, thereby increasing a time and a power consumption of barcode scanning.

SUMMARY

An embodiment of the present disclosure provides a display panel including a display array, an imaging array and a pinhole array layer. The display array includes a plurality of display pixels which are arrayed, and each of the display pixels includes a luminous element. The imaging array is disposed at a side of the display array facing away from a light exiting direction of the display panel, and includes a plurality of imaging pixels which are arrayed. The pinhole array layer is disposed at a side of the imaging array facing to the light exiting direction of the display panel, and includes a plurality of pinholes which are arrayed, the plurality of pinholes are corresponding to the plurality of imaging pixels.

For example, in the display panel provided by an embodiment of the present disclosure, each of the imaging pixels includes a switch transistor and a photodiode which are electrically connected.

For example, in the display panel provided by an embodiment of the present disclosure, the photodiode is a PIN junction type photosensitive diode.

For example, in the display panel provided by an embodiment of the present disclosure, the luminous element of each of the display pixels is a self-luminous element.

For example, in the display panel provided by an embodiment of the present disclosure, the display array includes a first surface and a second surface; the first surface and the second surface are disposed opposite to each other in a direction perpendicular to the imaging array; the second surface is closer to the imaging array, as compared to the first surface; in the direction perpendicular to the imaging array, the pinhole array layer is disposed between the first surface and the imaging array; each pinhole is configured as a hole-like light-transmitting region, and the pinhole array layer further includes a light-blocking region configured to separate adjacent pinholes from each other.

For example, in the display panel provided by an embodiment of the present disclosure, the pinhole array layer is disposed between the display array and the imaging array.

For example, in the display panel provided by an embodiment of the present disclosure, the light-blocking region of the pinhole array layer is formed of a nontransparent insulation material.

For example, in the display panel provided by an embodiment of the present disclosure, the light-blocking region of the pinhole array layer is formed of a nontransparent conductive layer, and the nontransparent conductive layer is configured to be connected to self-luminous elements of the plurality of display pixels of the display array.

For example, in the display panel provided by an embodiment of the present disclosure, the light-blocking region of the pinhole array layer is formed of a nontransparent structure of the display array; and each pinhole of the pinhole array layer is formed of an opening of the nontransparent structure.

For example, in the display panel provided by an embodiment of the present disclosure, at least a portion of the light-blocking region of the pinhole array layer is further configured as a pixel defining layer of the self-luminous element of each of the display pixels of the display array.

For example, in the display panel provided by an embodiment of the present disclosure, at least a portion of the light-blocking region of the pinhole array layer is further configured as a planar metallic electrode of the display array; and each pinhole of the pinhole array layer is formed of an opening of the planar metallic electrode.

For example, in the display panel provided by an embodiment of the present disclosure, each of the pinholes is disposed between adjacent two display pixels or disposed among adjacent four display pixels.

For example, in the display panel provided by an embodiment of the present disclosure, each of the imaging pixels is at least partly overlapped with a corresponding pinhole.

For example, in the display panel provided by an embodiment of the present disclosure, every three display pixels are corresponding to one of the imaging pixels and one of the pinholes.

For example, the display panel provided by an embodiment of the present disclosure further includes an image distance adjustment layer; the image distance adjustment layer includes a transparent material and is disposed at a side of the imaging array closer to the pinhole array layer.

For example, the display panel provided by an embodiment of the present disclosure further includes an object distance adjustment layer; the object distance adjustment layer includes a transparent material and is disposed at a side of the display array away from the pinhole array layer.

An embodiment of the present disclosure further provides a display device. The display device includes the above-mentioned display panel, a display driver circuit and an image detection circuit; the display driver circuit is connected to a plurality of display gate lines of the display array of the display panel so as to provide a scanning signal to the display pixels of the display array for displaying; the image detection circuit is connected to a plurality of imaging gate lines of the imaging array of the display panel so as to provide a scanning signal to the imaging pixels of the imaging array for imaging.

For example, in the display device provided by an embodiment of the present disclosure, the image detection circuit includes a comparison circuit, and the comparison circuit is configured to compare a signal obtained from the imaging pixels with a reference signal.

For example, the display device provided by an embodiment of the present disclosure further includes a controller, and the controller is configured to separate a time period for displaying from a time period for imaging, during operation of the controller.

For example, in the display device provided by an embodiment of the present disclosure, the controller is further configured, during the time period for imaging, to firstly scan part of the imaging gate lines to detect an imaging region and then scan an imaging gate line having not been scanned in the imaging region.

BRIEF DESCRIPTION OF THE DRAWINGS

Hereinafter, the drawings necessary for description of embodiments or related technologies will be briefly introduced so as to provide more definite explanations of the embodiments of the present disclosure. Obviously, the drawings described as below merely refer to some embodiments of the present disclosure and are not intended to constitute any limitation to the present disclosure.

FIG. 4b is a structural view of the display device in FIG. 4a;

DETAILED DESCRIPTION

Figure 1:
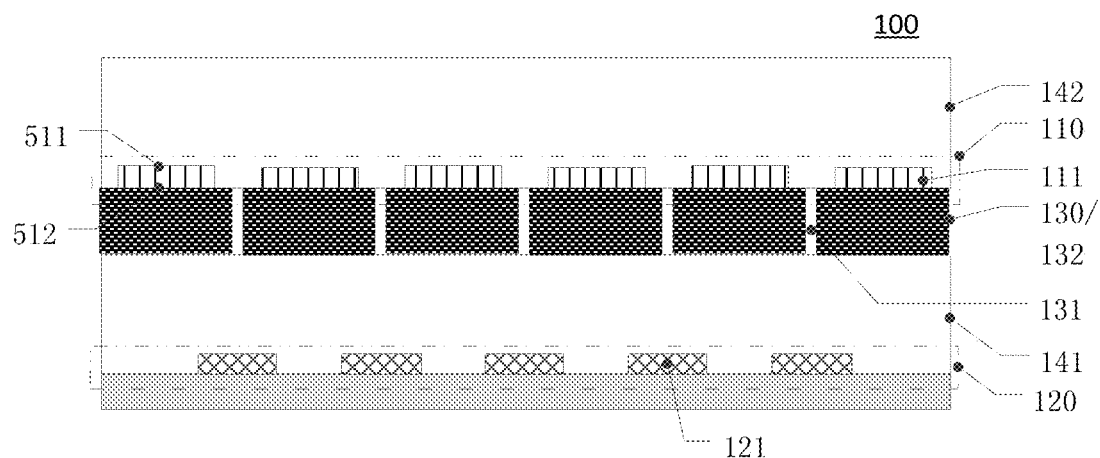
FIG. 1 is a sectional view of a display panel provided by an embodiment of the present disclosure.

In order to make objects, technical solutions and advantages of the embodiments of the present disclosure apparent, the technical solutions of the embodiments will be described in a clearly and fully understandable way in connection with the drawings related to the embodiments of the invention. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of the present disclosure provide a display panel and a display device which achieve a function of barcode scanning.

At least one embodiment of the present disclosure provides a display panel. The display panel includes a display array, an imaging array and a pinhole array layer. The display array includes a plurality of display pixels arranged in an array, in which each of the display pixels includes a luminous element. The imaging array is disposed at a side of the display array facing away from a light exiting direction of the display panel, and includes a plurality of imaging pixels arranged in an array. The pinhole array layer is disposed at a side of the imaging array facing to the light exiting direction of the display panel, and includes a plurality of pinholes arranged in an array, the plurality of pinholes are corresponding to the plurality of imaging pixels.

In some embodiments, for example, the display array can include a first surface and a second surface; the first surface and the second surface are disposed opposite to each other in a direction perpendicular to the imaging array; the second surface is closer to the imaging array, as compared to the first surface; in the direction perpendicular to the imaging array, the pinhole array layer is disposed between the first surface and the imaging array; the pinhole is configured as a hole-like light-transmitting region, and the pinhole array layer further includes a light-blocking region configured to separate adjacent pinholes from each other.

In some embodiments, for example, the pinhole array layer can be disposed between the display array and the imaging array; for another example, the pinhole array layer can also be disposed between the first surface and the second surface of the display array.

In such case, the pinhole array layer can be realized by a converted usage of the display array, and the light-blocking region of the pinhole array layer can be formed of a nontransparent structure of the display array, for example; each pinhole of the pinhole array layer can be formed of an opening of the nontransparent structure, for example.

For example, FIG. 1 is a sectional view of a display panel 100 provided by an embodiment of the present disclosure. As illustrated in FIG. 1, the display panel 100 can include a display array 110, an imaging array 120 and a pinhole array layer 130.

Figure 4A:
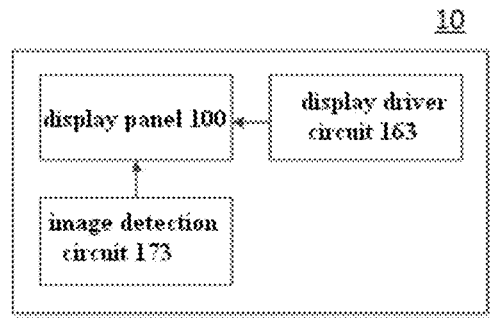
FIG. 4a is an illustrative block diagram of a display device provided by an embodiment of the present disclosure.
Figure 4B:
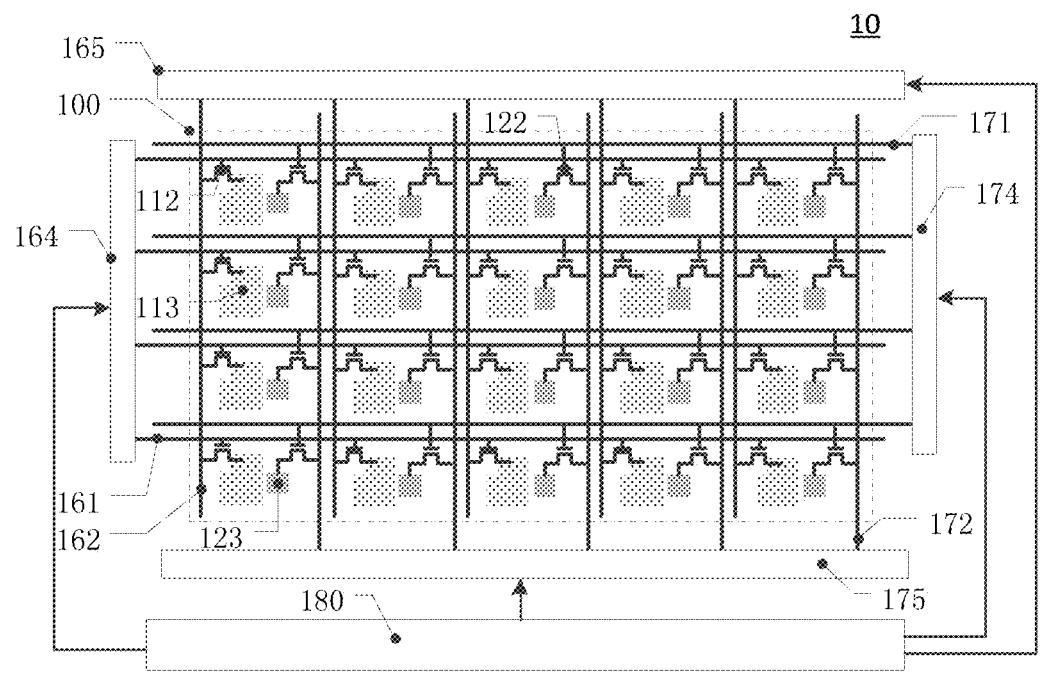

For example, the display array 110 can include a plurality of display pixels 111 arranged in an array, and each of the display pixels 111 can include a luminous element 113 (referring to FIG. 4b). For example, the type and the number of the luminous element 113 included in each of the display pixels 111 can be set according to actual application demands without particularly limited in the embodiments of the present disclosure.

For example, the luminous element 113 of each of the display pixels 111 can be a light-emitting diode element, including a self-luminous element (e.g., it can be an inorganic LED element or an OLED element or a QLED element or a Micro LED element). For example, each of the display pixels 111 can include one luminous element 113, and the luminous elements 113 of every adjacent three display pixels 111 can have a same luminous color or different luminous colors; for another example, each of the display pixels 111 can include a plurality of (e.g., three) luminous elements 113, and the plurality of luminous elements 113 can have different luminous colors from each other. For example, according to actual application demands, the luminous element 113 of each of the display pixels 111 can be electrically connected to a first switch transistor 112 (e.g., a thin film transistor, referring to FIG. 4b), and is driven by a driver circuit electrically connected to the first switch transistor 112 to emit light.

For example, as illustrated in FIG. 1, the display array 110 can include a first surface 511 and a second surface 512; the first surface 511 and the second surface 512 are disposed opposite to each other in a direction perpendicular to the imaging array 120; the second surface 512 is closer to the imaging array 120, as compared with the first surface 511. For example, the first surface 511 of the display array 110 can be a first surface of the display pixel 111, and the second surface 512 of the display array 110 can be a second surface of the display pixel 111.

For example, as illustrated in FIG. 1, the imaging array 120 can be disposed at a side of the display array 110 facing away from a light exiting side of the display panel 100, and can include a plurality of imaging pixels 121 arranged in an array. For example, the light exiting direction of the display panel 100 illustrated in FIG. 1 is an upward direction, and thus the imaging array 120 can be disposed below the display array 110. For example, each of the imaging pixels 121 can include a photodiode 123 and a second switch transistor 122 (referring to FIG. 4b), the photodiode 123 can convert an optical signal irradiated on the photodiode 123 into an electric signal; and the second switch transistor 122 can be electrically connected to the photodiode 123 so as to control whether or not the photodiode 123 is in a state of acquiring optical signal, and to control a time of acquiring the optical signal. For example, the type and the arrangement of the photodiode 123 in the imaging array 120 can be set according to actual application demands without particularly limited in the embodiments of the present disclosure. For example, the photodiode 123 can be a PIN junction type photosensitive diode, thereby improving a response speed of the photodiode 123. For example, the photodiode 123 can be formed on a base substrate during manufacturing the display array 110; for another example, the photodiode 123 can be pre-formed, and then disposed on the base substrate by welding, clamping, gluing or the like.

For example, as illustrated in FIG. 1, the pinhole array layer 130 can include a plurality of pinholes 131 arranged in an array, and the plurality of pinholes 131 are corresponding to the plurality of imaging pixels 121. For example, the pinhole 131 can be configured as a hole-like light-transmitting region. For example, the pinhole array layer 130 is light tight in locations except the pinholes 131; that is, the pinhole array layer 130 can further include a light-blocking region 132 which separates adjacent pinholes 131 from each other.

Figure 3A:
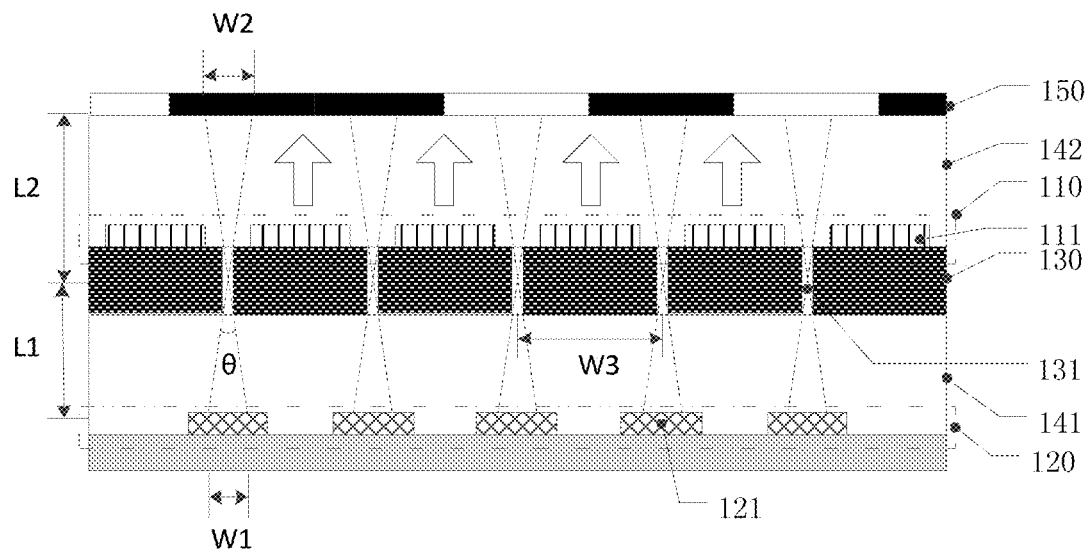
FIG. 3a is an exemplary diagram illustrating an imaging principle of the display panel illustrated in FIG. 1.

For example, the pinhole array layer 130 can be disposed at a side of the imaging array facing to the light exiting direction of the display panel (e.g., the hollow arrow in FIG. 3a indicates the light exiting direction of the display panel).

For example, in a direction perpendicular to the imaging array 120, the pinhole array layer 130 can also be disposed between the first surface 511 of the display array 110 and the imaging array 120 (that is, a surface of a side of the imaging array 120 closer to the display array 110). For example, a specific location of the pinhole array layer 130 can be set according to a forming method, a material and actual application demands of the pinhole array layer without particularly limited in the embodiments of the present disclosure.

For example, the pinhole array layer 130 can be disposed between the display array 110 and the imaging array 120. For example, as illustrated in FIG. 1, the pinhole array layer 130 can be implemented by a layer which is disposed separately from the display array 110; the pinhole array layer 130, for example, can be formed from a single layer of nontransparent material through a patterning process and disposed below the display array 110 (luminous element), and the nontransparent material can be a metallic material or an insulation material. For another example, the pinhole array layer 130 can also be realized by a converted usage of other structural layer(s); for example, when the luminous element 113 is a light-emitting diode element, at least a portion of the light-blocking region 132 of the pinhole array layer 130 can be formed of a nontransparent conductive layer, and the nontransparent conductive layer can be configured to be connected to the light-emitting diode elements (e.g., self-luminous element) of the plurality of display pixels 111 of the display array 110.

For example, in the direction perpendicular to the imaging array 120, the pinhole array layer 130 can also be disposed between the first surface 511 and the second surface 512 of the display array 110. In such case, the pinhole array layer 130 can be realized by a converted usage of partial structure of the display array 110, the light-blocking region 132 can be, for example, formed of a nontransparent structure of the display array 110, and the pinhole 131 of the pinhole array layer 130 can be, for example, formed of an opening of the nontransparent structure.

For example, when the luminous element 113 of the display pixel 111 in FIG. 1 is a light-emitting diode element (e.g., OLED element), at least a portion of the light-blocking region 132 of the pinhole array layer 130 can also be configured as a planar metallic electrode of the display array 110, and the pinhole 131 of the pinhole array layer 130 is formed of an opening of the planar metallic electrode.

Figure 7A:
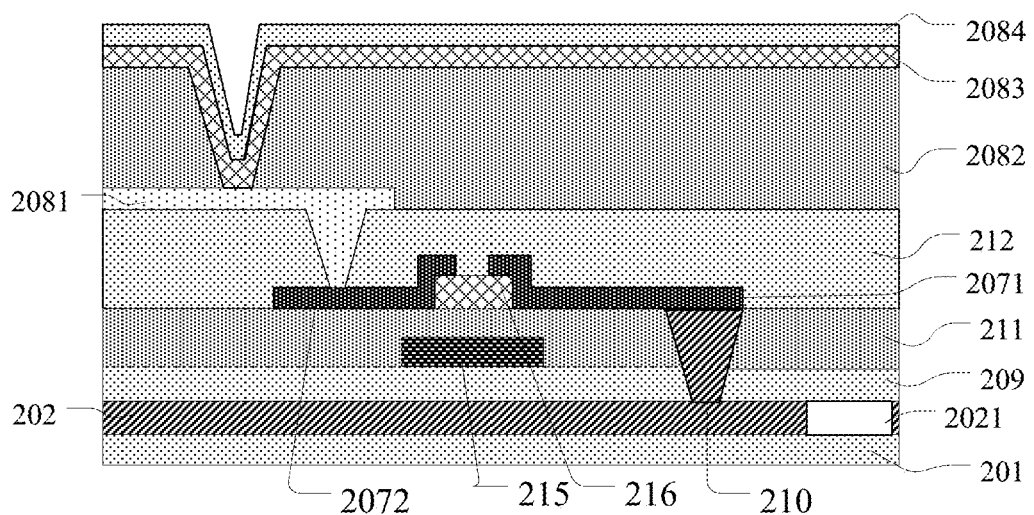
FIG. 7a is a sectional view of a display pixel in a display panel provided by an embodiment of the present disclosure.

More specifically, FIG. 7a is a sectional view of a display pixel provided by an embodiment of the present disclosure. Taking OLED as an example, the display pixel includes an organic light-emitting diode (OLED); a power supply wiring 202, a first insulating layer 209, a switch transistor, a driver transistor and an OLED element are sequentially disposed on a base substrate 201. The driver transistor includes a source 2071, a drain 2072, a gate 215 and an active layer 216. The power supply wiring 202 is a planar nontransparent metallic electrode formed on a surface of the base substrate 201, and the planar metallic electrode is formed with a plurality of openings 2021 so that the planar metallic electrode can be used as at least a portion of the light-blocking region of the pinhole array layer (e.g., it can be used as the entire light-blocking region of the pinhole array layer). The base substrate is provided with the imaging array (not illustrated) formed by the imaging pixels. The first insulating layer 209 is covering on the power supply wiring 202. As illustrated in FIG. 7a, a first via hole structure 210 is formed in a gate insulating layer 211 and the first insulating layer 209; and the power supply wiring 202 is connected to the source 2071 of the driver transistor through the first via hole structure 210. The driver transistor is provided with an OLED element used as the luminous element; and the OLED element includes an anode 2081, a pixel defining layer 2082, a light-emitting layer 2083, a cathode 2084 and the like. The anode 2081 is eclectically connected to the drain 2072 of the driver transistor through a second via hole structure which penetrates through a second insulating layer 212. The pixel defining layer 2082 is formed on the anode 2081 of the OLED element, the light-emitting layer 2083 is formed in an opening portion of the pixel defining layer 2082, and the cathode 2084 is formed on the light-emitting layer 2083. The first insulating layer 209, the gate insulating layer 211, the second insulating layer 212, the pixel defining layer 2082 and the like are all prepared by a transparent material.

For another example, when the luminous element 113 of the display pixel 11 in FIG. 1 is a light-emitting diode element (e.g., OLED element), at least a portion of the light-blocking region 132 of the pinhole array layer 130 can also be configured as a pixel defining layer of the OLED element of each of the display pixels 111 of the display array 110, and the pixel defining layer is prepared by an non-transparent material.

Figure 7B:
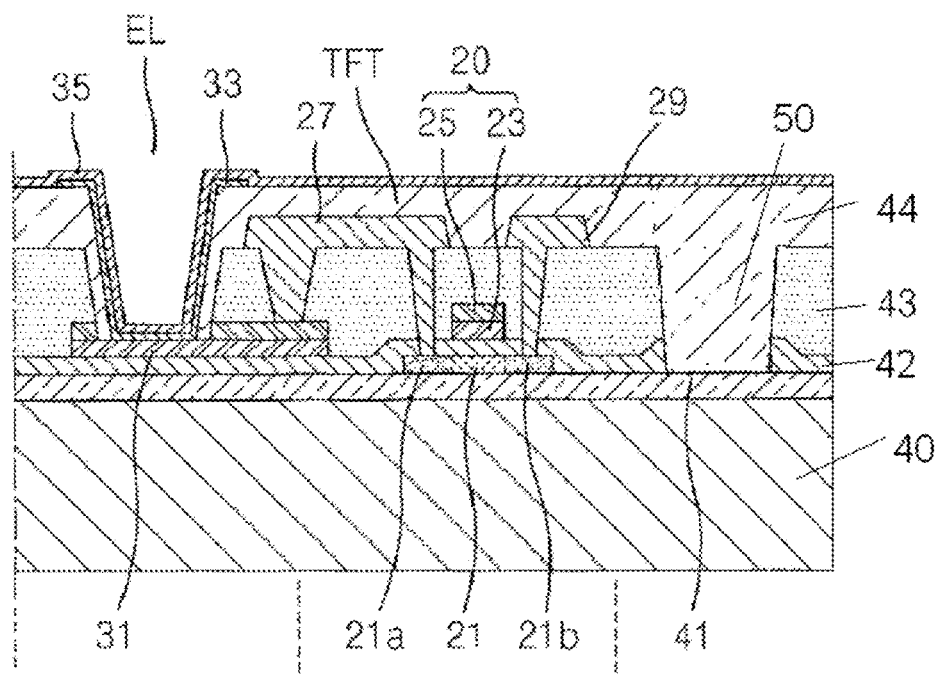
FIG. 7b is a sectional view of another display pixel in a display panel provided by an embodiment of the present disclosure.

More specifically, FIG. 7b is a sectional view of another display pixel provided by an embodiment of the present disclosure. The display pixel includes an organic light-emitting diode (OLED); a buffering layer 41, an active layer 21, a gate insulating layer 42, a pixel electrode 31, a pixel defining layer 43, a source/drain electrode layer, a passivation layer 44, a light-emitting layer 33 and an opposite electrode 35 are sequentially disposed on a base substrate 40. The active layer 21 includes a source region 21a and a drain region 21b. The active layer 21 is provided with a gate 20 of a thin film transistor (TFT), the gate 20 is formed of a double-layered conductive layer and includes a lower layer 23 and an upper layer 25. The pixel defining layer 43 is formed of, for example, a nontransparent insulation material (e.g., a resin material doped with carbon), and is provided with an opening 50, so that the pixel defining layer 43 can be used as at least a portion of the light-blocking region of the pinhole array layer. The base substrate 40 is provided with an imaging array (not illustrated) formed by the imaging pixels. The pixel defining layer 43 is further provided with a via hole which exposes the source region 21a and the drain region 21b of the active layer 21, and a via hole which exposes the pixel electrode, so that the source 27 can electrically connect the pixel electrode 31 to the source region 21a, and the drain 29 can be electrically connected to the drain region 21b. The passivation layer 44 is covering on the pixel defining layer, and is provided with an opening which exposes the pixel electrode 31, so that the light-emitting layer 33 is formed in the opening. The pixel electrode 31, the light-emitting layer 33, and the opposite electrode 35 constitute an organic light-emitting (EL) structure. Herein, the passivation layer 44, the buffering layer 41 and the like are prepared by a transparent material.

Although a plurality of embodiments with reference to OLED are set forth in the present disclosure by way of example, those skilled in the art should be appreciated that the technical solutions above are applicable for any luminous element with self-luminous characteristic such as QLED (Quantum Dot Light Emitting Diodes) and Micro LED.

Figure 2A:
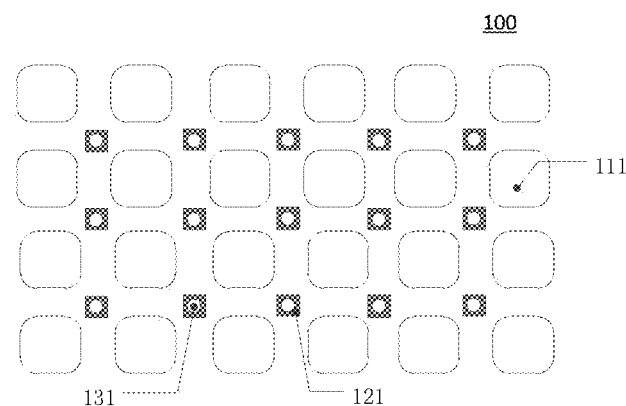
FIG. 2a is a plan view of the display panel illustrated in FIG. 1.
Figure 2B:
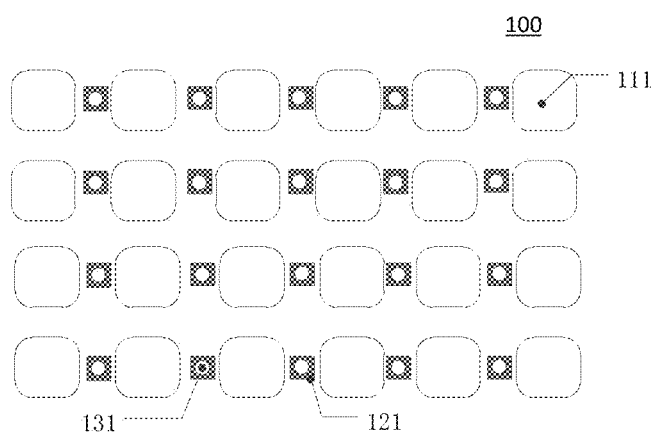
FIG. 2b is another plan view of the display panel illustrated in FIG. 1.
Figure 2C:
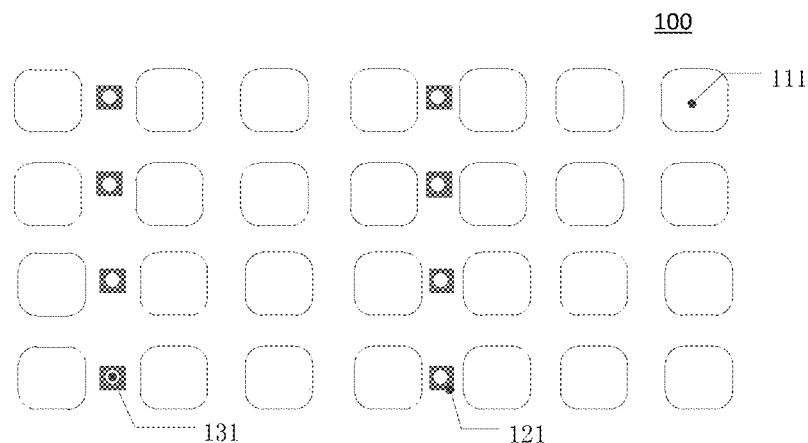
FIG. 2c is yet another plan view of the display panel illustrated in FIG. 1.

For example, locations of the pinholes 131 in the pinhole array layer 130 can be set according to actual application demands without particularly limited in the embodiments of the present disclosure. For example, as illustrated in FIG. 2a, each of the pinholes 131 can be disposed between adjacent four display pixels 111; for another example, as illustrated in FIG. 2b, each of the pinholes 131 can be disposed between adjacent two display pixels 111; for yet another example, as illustrated in FIG. 2c, under the circumstance that the display array 110 has a relatively greater resolution ratio or the imaging array 120 requires for relatively smaller resolution ratio, every three display pixels 111 can correspond to one pinhole 131, so as to decrease the number of the photodiode 123 as disposed and the manufacturing cost. For example, as illustrated in FIG. 1 and FIG. 2, each of the imaging pixels 131 can be at least partly overlapped with the corresponding pinhole 131; for another example, according to actual demands, under the circumstance that light transmitting through the pinhole 131 can be irradiated onto the corresponding imaging pixel 121, each of the imaging pixels 121 can have no overlapped portion with the corresponding pinhole 131 in the direction perpendicular to the display array 110.

Figure 3B:
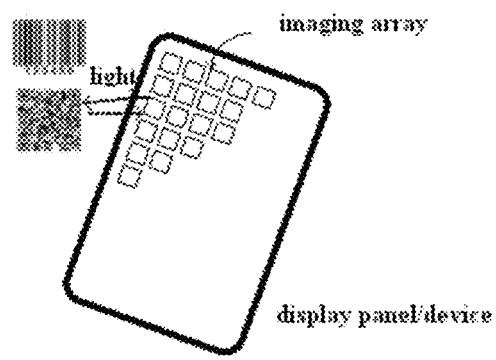
FIG. 3b is a diagram illustrating an application scenario of the display panel in FIG. 1.

For example, FIG. 3a is an exemplary diagram illustrating an imaging principle of the display panel illustrated in FIG. 1, and FIG. 3b illustrates an application scenario of the display panel in FIG. 1. For example, as illustrated in FIG. 3a and FIG. 3b, when it needs to perform barcode scanning, the display panel 100 can be directly placed to cover the barcode so that light emitted from the luminous element 113 of the display pixel 111 irradiates onto the barcode 150, and then is reflected, and imaged on the imaging pixel 121 through the pinhole 131; for a barcode image unit with a black color in the barcode, the light reflected onto the imaging pixel 121 has a low intensity, which results in a weak electric signal outputted by the photodiode 123; for a barcode image unit with a white color in the barcode, the light reflected onto the imaging pixel 121 has a strong intensity, which results in a strong electric signal outputted by the photodiode 123; in this way, it can determine the color of the barcode image unit corresponding to the photodiode 123/imaging pixel 121 based on the intensity of the electric signal outputted by the photodiode 123. Because each image unit of the barcode image corresponds to at least one imaging pixel 121 of the imaging array 120, the barcode can be imaged by the imaging array 120 without any focusing element such as lens, thereby the function of barcode (one-dimensional barcode or two-dimensional barcode or other barcodes) scanning can be achieved.

For example, a width w and a thickness d of the pinhole 131, a distance L1 between the pinhole 131 and the imaging pixel 121, a distance L2 between the pinhole 131 and the barcode, and a distance W3 between every two adjacent pinholes 131 can be set according to actual application demands without particularly limited in the embodiments of the present disclosure. For example, as illustrated in FIG. 3, under the circumstance that the imaging pixel 121 is disposed right below the pinhole 131, an image of the barcode image unit as formed on the imaging pixel 121 has a width $W1=2\times L1\times \tan(\theta/2)$, and a portion of the barcode imaged through the pinhole 131 has a width $W2=2\times L2\times \tan(\theta/2)$, in which $\tan(\theta/2)=w/d$. For example, in order to prevent the image of the barcode image unit from being imaged on an imaging pixel 121 other than the corresponding imaging pixel 121, it requires that W1 is smaller than or equal to W3. For example, in order to prevent more than one barcode image unit from being imaged on a single imaging pixel, it requires that W2 is smaller than a width of the barcode image unit. For example, in order to increase an accuracy of analyzing the barcode, it can allow two or more imaging pixels 121 to correspond to one barcode image unit; that is, W3 is smaller than or equal to one half of the width of the barcode image unit.

For example, in order to set the distance L1 from the pinhole 131 to the imaging pixel 121 and the distance L2 from the pinhole 131 to the barcode more precisely, the display panel 100 can further include an image distance adjustment layer 141 and an object distance adjustment layer 142. For example, the image distance adjustment layer 141 can include a transparent material and is disposed at a side of the imaging array 120 closer to the pinhole array layer 130; the object distance adjustment layer 142 can include a transparent material and is disposed at a side of the display array 110 away from the pinhole array layer 130. It should be noted that, in the display panel 100 required for other layers (e.g., a protective glass substrate) to be disposed over the object distance adjustment layer 142, the thickness of the object distance adjustment layer 142 has to be set according to the thickness of the other layers disposed over the object distance adjustment layer 142 as well as the distance L2 from the pinhole 131 to the barcode.

In the embodiments mentioned above, although a plurality of examples which adopt self-luminous element for illustration, have been set forth in the present disclosure, the present technical solution is also feasible for LCD devices which need a backlight. When display pixels in a LCD device are used, a barcode region is illuminated by the backlight of liquid crystals, and a content of the barcode (information of the barcode) can be obtained from the light reflected by the barcode with a photodiode based on a principle similar to that in the foregoing embodiments. A propagation path of the light in the LCD device cannot have a definite geometric description as the self-luminous element does, due to the liquid crystals contained in the LCD device. When the technical solution of the present disclosure is applied in a LCD device, a path mode of light propagating in the corresponding LCD device can be pre-stored in an internally installed processer to be cooperated with the imaging array, so as to accurately determine the content of the barcode.

At least one embodiment of the present disclosure further provides a display device. The display device includes the above-mentioned display panel, a display driver circuit and an image detection circuit; the display driver circuit is connected to a plurality of display gate lines of the display array of the display panel, so as to provide a scanning signal to the display pixels of the display array for displaying; the image detection circuit is connected to a plurality of imaging gate lines of the imaging array of the display panel, so as to provide a scanning signal to the imaging pixels of the imaging array for imaging. The display panel and the display device achieve the function of barcode scanning.

For example, FIG. 4a is an illustrative block diagram of a display device 10 provided by an embodiment of the present disclosure, and FIG. 4b is an illustrative structural view of the display device 10 in FIG. 4a. For example, the display device 10 can include any display panels 100 provided by an embodiment of the present disclosure, a display driver circuit 163 and an image detection circuit 173.

For example, the display driver circuit 163 can include a first display driver circuit 164 and a second display driver circuit 165; the first display driver circuit 164 can be connected to a plurality of display gate lines 161 of the display array 110 of the display panel 100, so as to provide a scanning signal to the display pixels 111 of the display array 110; the second display driver circuit 165 can be connected to a plurality of display signal lines 162 of the display array 110 of the display panel 100, so as to provide a data signal to the display pixels 111 of the display array 110; in this way, the display driver circuit 163 can drive the display array 111 to achieve a function of displaying.

For example, the image detection circuit 173 can include a first image detection circuit 174 and a second image detection circuit 175; the first image detection circuit 174 can be connected to a plurality of imaging gate lines 171 of the imaging array 120 of the display panel 100, so as to provide a scanning signal to the imaging pixels 121 of the imaging array 120; the second image detection circuit 175 can be connected to a plurality of imaging signal lines 172 of the imaging array 120 of the display panel 100, so as to read out an electric signal outputted by the imaging pixel 121; in this way, the image detection circuit 173 can allow the imaging array 121 to achieve functions of imaging and barcode scanning.

For example, the first display driver circuit 164, the second display driver circuit 165, the first image detection circuit 174 and the second image detection circuit 175 can be set according to actual application demands without particularly limited in the embodiments of the present disclosure. For example, the functions of the first display driver circuit 164 and the first image detection circuit 174 can be achieved by same one gate scanning circuit; for another example, the first display driver circuit 164 and the first image detection circuit 174 can also be two separate components. For example, the first display driver circuit 164 and the second display driver circuit 165 can be achieved by same one driver circuit; for another example, the first display driver circuit 164 and the second display driver circuit 165 can also be two separate components.

Figure 6:
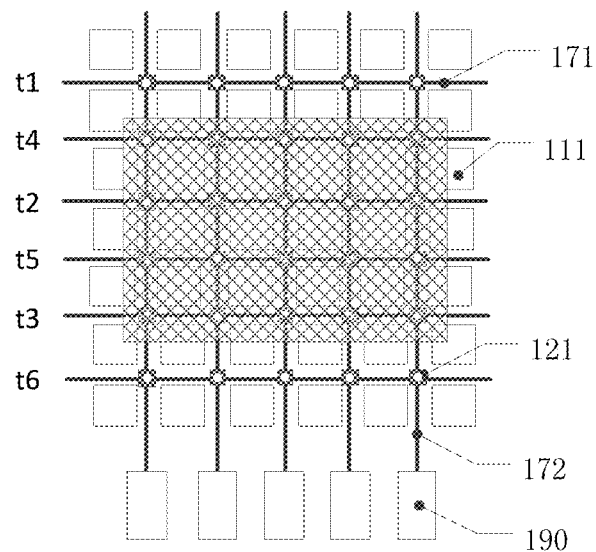
FIG. 6 is a barcode scanning method of a display device provided by an embodiment of the present disclosure.

For example, specific components and constitution of the image detection circuit 173 can be configured according to actual application demands without particularly limited in the embodiments of the present disclosure. For example, the image detection circuit 173 can include at least one image detection circuit unit 190. For example, as illustrated in FIG. 6, every column of imaging pixels 121 can be provided with one image detection circuit unit 190 so as to improve a rate of barcode scanning.

Figure 5:
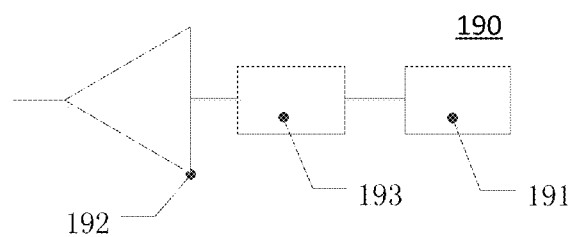
FIG. 5 is an illustrative block diagram of an image detection circuit unit provided by an embodiment of the present disclosure.

For example, as illustrated in FIG. 5, in an embodiment, every image detection circuit unit 190 can include a comparison circuit 191, and the comparison circuit 191 can be configured to compare a signal (e.g., an electric signal) obtained from the imaging pixel 121 with a reference signal, so as to convert the electric signal outputted by the imaging pixel 121 into a digital signal. For example, the comparison circuit 191 can be a comparator or an analog-digital converter (ADC). For example, when a comparator is used for converting an analog signal obtained from the imaging pixel 121 into a digital signal, a power consumption of the image detection circuit 173 can be reduced because the barcode image contains only black and white colors.

For example, as illustrated in FIG. 5, every image detection circuit unit 190 can further include a filter circuit 193. For example, prior to be delivered to the comparison circuit 191, the electric signal outputted by the imaging pixel 121 can be filtered by the filter circuit 193, so as to improve a signal to noise ratio (SNR) of the electric signal outputted by the imaging pixel 121.

For example, as illustrated in FIG. 5, every image detection circuit unit 190 can further include a current-voltage converter circuit 192 which can be configured to convert a current signal outputted by the imaging pixel 121 into a voltage signal, and to deliver the voltage signal to the filter circuit 193. However, the embodiments of the present disclosure are not limited thereto, for example, the current-voltage converter circuit can further be configured to convert an electric signal outputted by the filter circuit 193 into a voltage signal, and to deliver the voltage signal to the comparison circuit 191.

For example, the display device 10 can further include a controller 180. The controller 180 can be electrically connected to the display driver circuit 163 and the image detection circuit 173, and can be configured to separate a time period for displaying from a time period for imaging, during operation. For example, during the time period for displaying, the controller 180 can control the display driver circuit 163, and can also allow luminous elements 113 of different display pixels 111 of the display array 110 to emit light with different intensities so as to perform displaying operation; while during the time period for imaging, the controller 180 can control the display driver circuit 163, and can also allow luminous elements 113 of different display pixels 111 of the display array 110 to emit light with a same intensity so as to perform imaging operation.

For example, in order to reduce the time of barcode scanning, the controller 180 can be further configured to firstly scan part of the imaging gate lines 171 to detect an imaging region, and then scan the imaging gate lines 171 having not been scanned in the imaging region, during the time period for imaging. For example, during the time period for imaging, the controller 180 can be configured to firstly scan odd-numbered rows of imaging gate lines 171 to determine an imaging region of the barcode, and then scan even-numbered rows of imaging gate lines 171 having not been scanned in the imaging region.

For example, as illustrated in FIG. 6, at time point t1, t2 and t3, respectively, scanning a first row, a third row and a fifth row of imaging gate lines 171, respectively. The imaging pixels 121 corresponding to the third row and the fifth row of gate lines are outputted with image signals, thus the first row through the sixth row are determined as the imaging region. Subsequently, further scanning of even-numbered rows of imaging gate lines 171 between the first row and the sixth row is performed; that is, at time point t4, t5 and t6, respectively, scanning a second row, a fourth row and a sixth row of imaging gate lines 171, respectively. Obviously, FIG. 6 merely illustrates the number of rows of the imaging pixels 121 of the display device 10 by way of example, which can be set according to actual application demands. For example, 1024 rows of imaging pixels 121 can be included. Therefore, by utilizing the above-mentioned scanning method, the time of barcode scanning can be reduced.

The embodiments of the present disclosure provide a display panel and a display device which achieve the function of barcode scanning.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

The present application claims priority of Chinese patent application No. 201710174810.2 filed on Mar. 22, 2017, the disclosure of which is incorporated herein in its entirety by reference.

What is claimed is:

1. A display panel, comprising:
a display array comprising a plurality of display pixels which are arrayed, wherein each of the display pixels comprises a luminous element;
an imaging array disposed at a side of the display array facing away from a light exiting direction of the display panel, wherein the imaging array comprises a plurality of imaging pixels which are arrayed; and
a pinhole array layer disposed at a side of the imaging array facing to the light exiting direction of the display panel, wherein the pinhole array layer comprises a plurality of pinholes which are arrayed, the plurality of pinholes are corresponding to the plurality of imaging pixels.

2. The display panel according to claim 1, wherein each of the imaging pixels comprises a switch transistor and a photodiode which are electrically connected.

3. The display panel according to claim 2, wherein the photodiode is a PIN junction type photosensitive diode.

4. The display panel according to claim 1, wherein the luminous element of each of the display pixels is a self-luminous element.

5. The display panel according to claim 1, wherein
the display array comprises a first surface and a second surface, the first surface and the second surface are disposed opposite to each other in a direction perpendicular to the imaging array, the second surface is closer to the imaging array as compared to the first surface;
in the direction perpendicular to the imaging array, the pinhole array layer is disposed between the first surface and the imaging array;
each pinhole is configured as a hole-like light-transmitting region, and the pinhole array layer further comprises a light-blocking region configured to separate adjacent pinholes from each other.

6. The display panel according to claim 5, wherein the pinhole array layer is disposed between the display array and the imaging array.

7. The display panel according to claim 6, wherein the light-blocking region of the pinhole array layer is formed of a nontransparent insulation material.

8. The display panel according to claim 6, wherein the light-blocking region of the pinhole array layer is formed of a nontransparent conductive layer, and the nontransparent conductive layer is configured to be connected to luminous elements of the plurality of display pixels of the display array.

9. The display panel according to claim 5, wherein the light-blocking region of the pinhole array layer is formed of a nontransparent structure of the display array; and
each pinhole of the pinhole array layer is formed of an opening of the nontransparent structure.

10. The display panel according to claim 9, wherein at least a portion of the light-blocking region of the pinhole array layer is further configured as a pixel defining layer of the luminous element of each of the display pixels of the display array.

11. The display panel according to claim 9, wherein at least a portion of the light-blocking region of the pinhole array layer is further configured as a planar metallic electrode of the display array; and
each pinhole of the pinhole array layer is formed of an opening of the planar metallic electrode.

12. The display panel according to claim 1, wherein each of the pinholes is disposed between adjacent two display pixels or disposed among adjacent four display pixels.

13. The display panel according to claim 1, wherein each of the imaging pixels is at least partly overlapped with a corresponding pinhole.

14. The display panel according to claim 1, wherein every three display pixels are corresponding to one of the imaging pixels and one of the pinholes.

15. The display panel according to claim 1, further comprising an image distance adjustment layer,
wherein the image distance adjustment layer comprises a transparent material and is disposed at a side of the imaging array closer to the pinhole array layer.

16. The display panel according to claim 1, further comprising an object distance adjustment layer,
wherein the object distance adjustment layer comprises a transparent material and is disposed at a side of the display array away from the pinhole array layer.

17. A display device, comprising:
the display panel according to claim 1;
a display driver circuit connected to a plurality of display gate lines of the display array of the display panel so as to provide a scanning signal to the display pixels of the display array for displaying; and
an image detection circuit connected to a plurality of imaging gate lines of the imaging array of the display panel so as to provide a scanning signal to the imaging pixels of the imaging array for imaging.

18. The display device according to claim 17, wherein the image detection circuit comprises a comparison circuit which is configured to compare a signal obtained from the imaging pixels with a reference signal.

19. The display device according to claim 17, further comprising a controller, wherein the controller is configured to separate a time period for displaying from a time period for imaging.

20. The display device according to claim 19, wherein the controller is further configured, during the time period for imaging, to firstly scan part of the imaging gate lines to detect an imaging region and then scan an imaging gate line having not been scanned in the imaging region.

* * * * *